(12) United States Patent
Wiesbauer et al.

(10) Patent No.: US 7,629,916 B2
(45) Date of Patent: Dec. 8, 2009

(54) MULTIPLE OUTPUT TIME-TO-DIGITAL CONVERTER

(75) Inventors: Andreas Wiesbauer, Poertschach (AT); Luis Hernandez, Madrid (ES); Wim Dehaene, Kessel-Lo (BE); Jorg Daniels, Leuven (BE); Dietmar Straeussnigg, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/062,538

(22) Filed: Apr. 4, 2008

(65) Prior Publication Data

US 2009/0251349 A1    Oct. 8, 2009

(51) Int. Cl.
*H03M 1/50*    (2006.01)

(52) U.S. Cl. ........................... 341/166; 341/155

(58) Field of Classification Search ............... 341/166, 341/158, 163, 122, 118, 155, 172, 169
See application file for complete search history.

(56) References Cited

U.S. PATENT DOCUMENTS

| | | | |
|---|---|---|---|
| 6,177,901 B1 * | 1/2001 | Pan et al. | 341/166 |
| 7,403,073 B2 * | 7/2008 | Kossel et al. | 331/16 |
| 2008/0295603 A1 * | 12/2008 | Shin et al. | 73/753 |

OTHER PUBLICATIONS

Engel Roza, "Poly-Phase Sigma—Delta Modulation", IEEE Transactions on Circuits and Systems—II: Analog and Digital Signal Processing, vol. 44, No. 11, November 1997, pp. 915-923.

* cited by examiner

*Primary Examiner*—Brian Young
(74) *Attorney, Agent, or Firm*—SpryIP, LLC

(57) ABSTRACT

A multiple output time-to-digital converter (TDC) and an Analog-to-Digital Converter (ADC) incorporating the multiple output TDC is disclosed.

13 Claims, 4 Drawing Sheets

MULTIPLE OUTPUT TIME-TO-DIGITAL CONVERTER

BACKGROUND

Time-to-digital converters (TDCs) are increasingly popular in many applications including time of flight measurements, phase detectors in phase-locked-loops (PLLs), data converters, high speed signal capturing, demodulators, and other measurement or instrumentation applications. For example, TDCs have been implemented in pulsed time-of-flight laser radars used in traffic speed cameras, millimeter-precision object detection and localization, anti-collision radars and proximity sensors, and so forth. These applications typically require a precise single-shot measurement within a high dynamic range.

With the downscaling of the minimal feature size of modern submicron CMOS technologies, TDCs are very useful in other applications as well. This is the case when it is profitable to replace badly scaling analog circuits with TDCs. Since technology scaling implies voltage scaling while noise does not scale along, variability becomes more important. This requires more effort to be put into analog circuits, which leads to increased power consumption. Digital speed however does scale with technology. The robustness of digital circuits is much more preserved, although it is also compromised with variability. However, since TDCs directly profit from enhanced speed performance, switching from the analog to the digital time domain can significantly reduce the power consumption for equal performance, especially for designs in sub-100 nm technology nodes.

In this context, an alternative scheme for an Analog to Digital Converter (ADC) has been to use an Asynchronous Delta-Sigma Modulator (ADSM) in combination with a high precision TDC. The ADSM converts the analog input u(t) to a duty cycle modulated square wave y(t) with a limit cycle frequency $f_{lc}$ of $$f_{lc} = (\pi/2h) f_{int}$$

with the hysteresis value h of the comparator and the unit-gain frequency $f_{int}$ of the integrator. The time information of the square wave is measured with the TDC which returns a digital value m[k]. Finally a digital demodulation algorithm is used to demodulate the square wave back to the original input signal, but now in the digital form z[k].

The in-band noise can further be reduced by placing the ADSM, TDC and demodulator in an n-th order delta-sigma loop that shapes the quantization noise of the TDC to higher frequencies.

The main drawback of a multi-bit feedback loop is the need of a high-precision Digital to Analog Converter (DAC), which must have the same linearity requirements as the whole converter. This is increasingly difficult to achieve with higher numbers of bits in the TDC output, which makes the DAC a very expensive component in terms of area and power consumption.

BRIEF DESCRIPTION OF THE DRAWINGS

The detailed description is described with reference to the accompanying figures. The use of the same reference numbers in different instances in the description and the figures may indicate similar or identical items.

DETAILED DESCRIPTION

At least one implementation described herein includes a system configured to perform analog-to-digital signal conversion. The system may be implemented on a wireless device and may include one or more electronic components configured to receive an input signal and a feedback signal and to provide as an output a binary continuous time signal. The system may also include a time-to-digital converter (TDC) configured to receive the binary continuous time signal and to provide a multilevel discrete time and discrete amplitude signal and a binary discrete time signal.

Also disclosed is a TDC that includes an input terminal to receive a binary continuous time signal. The TDC may provide to a first output terminal a multilevel discrete time and discrete amplitude signal. The apparatus may also provide a binary discrete time signal to a second output terminal.

Also disclosed is a method for processing a signal using a time-to-digital converter. The method includes inputting a binary continuous time signal into the time-to-digital converter, generating a multilevel discrete time and discrete amplitude signal, and generating a binary discrete time signal.

Exemplary Device

Figure 1:
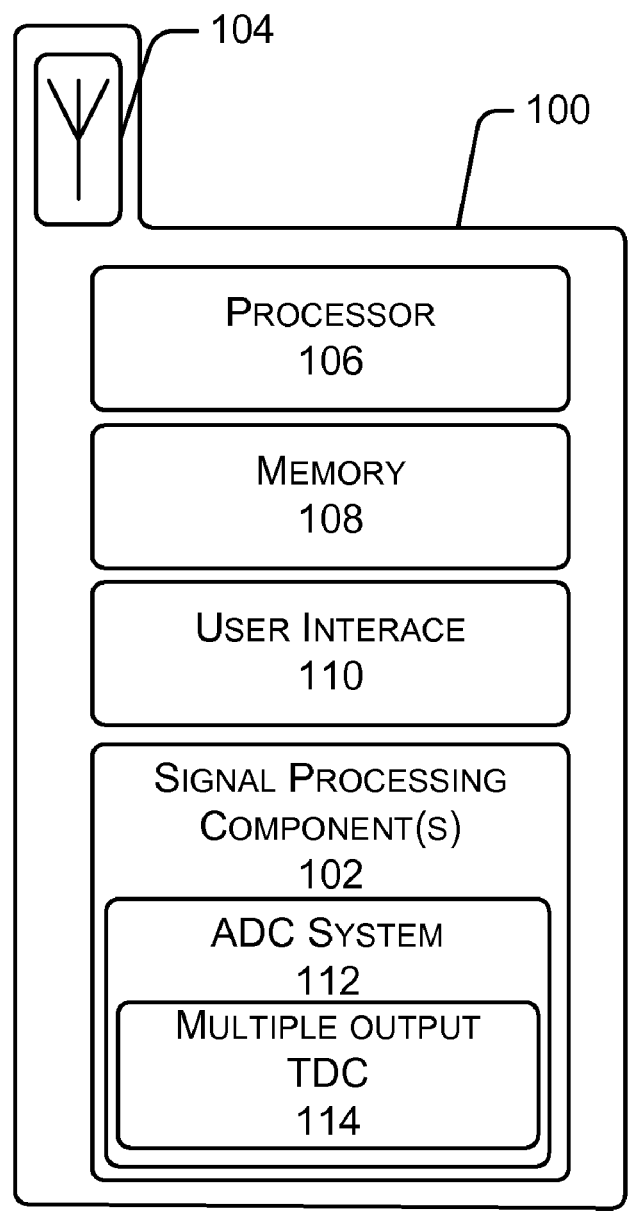
FIG. 1 is a schematic representation of a device having signal processing components including a multiple output time-to-digital converter.

FIG. 1 shows an exemplary device 100 for processing signals. The device 100, such as a wireless device, may have one or more signal processing components 102. The device 100 may be cellular phone, wireless media device, personal computer or other electronic device. For example, the device 100 may be a personal digital assistant (PDA), a media player device, a portable gaming device, a GPS device, a wireless access point (WAP) and/or any other suitable device.

The signal processing components 102 process signals received from various sources associated with device 100 including, but not limited to, an antenna 104, a processor 106, memory 108, a user interface 110, and so forth. The signal processing components 102 may include a system 112 to perform analog-to-digital conversion, such as for example an analog to digital converter (ADC). The system 112 may include a time-to-digital converter (TDC) 114 as will be set forth in more detail below.

It will be appreciated by one skilled in the art that FIG. 1 is an exemplary schematic. Thus, certain details of the device 100, including analog-to-digital conversion system 112 and time-to-digital conversion apparatus 114, have been omitted for simplicity of discussion.

Exemplary System

Figure 2:
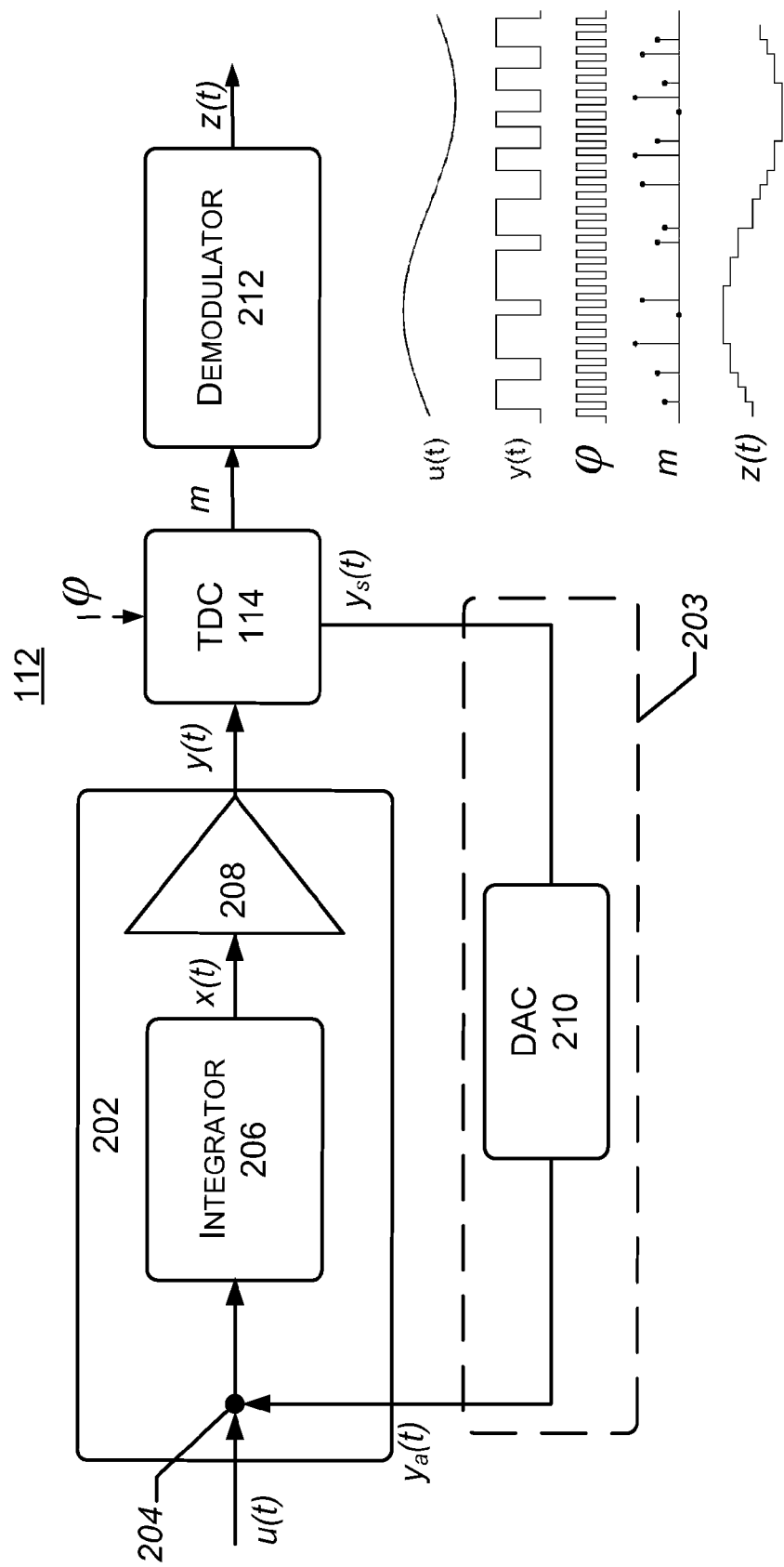
FIG. 2 is a schematic representation of one exemplary system for analog to digital conversion utilizing a multiple output TDC.

FIG. 2 shows one implementation of the analog-to-digital conversion system 112. The system 112 may include one or more electronic components (collectively referred to as components 202) configured to receive an input signal u(t) and a feedback signal $y_a(t)$ and to provide a binary continuous time signal y(t). The system 112 may also include a TDC 114 configured to receive the binary continuous time signal y(t) and to provide a multilevel discrete time and discrete amplitude signal m and a binary discrete time signal $y_s(t)$.

The system 112 is configured as an analog to digital converter (ADC) with a feedback path 203, shown generally in the figure as a dashed line. The input signal u(t) is provided to a node 204 and combined with a feedback signal $y_a(t)$. The combined signal is provided to an integrator 206. The integrator 206 provides a signal x(t) to a relay 208, which outputs a pulse width modulated binary continuous time signal y(t) to the TDC 114. The TDC 114 performs a measurement of the signal y(t) and generates the signals m and $y_s(t)$. The binary discrete time signal $y_s(t)$ is provided to a digital-to-analog converter (DAC) 210, which generates the feedback signal $y_a(t)$. The DAC 210 may be a single bit DAC, saving area and power and increasing the speed of the feedback path 203. The feedback path 203 may be configured to utilize the binary discrete time signal $y_s(t)$ for performing a noise shaping function. Some exemplary waveforms are shown in FIG. 2 for illustrative purposes; however, other waveforms may be propagated or processed through the system 112.

Signal m is a multilevel discrete time and discrete amplitude signal that carries information about the edges of the pulse width modulated signal y(t). Signal m is provided to a demodulator 212. The demodulator 212, which may be a conventional demodulator as well understood in the art, demodulates the signal m. The demodulator 212 provides a demodulated signal z(t) as a digital representation of the analog input signal u(t).

The signal m may be asynchronous or synchronous in nature. For example, an optional clock signal φ may be provided to the TDC 114. The signal m may be synchronized with respect to this clock signal φ. Alternatively, the TDC may be operated without reference to clock signal φ to generate an asynchronous discrete time and discrete amplitude signal m.

Exemplary Time-to-Digital Converter

Figure 3:
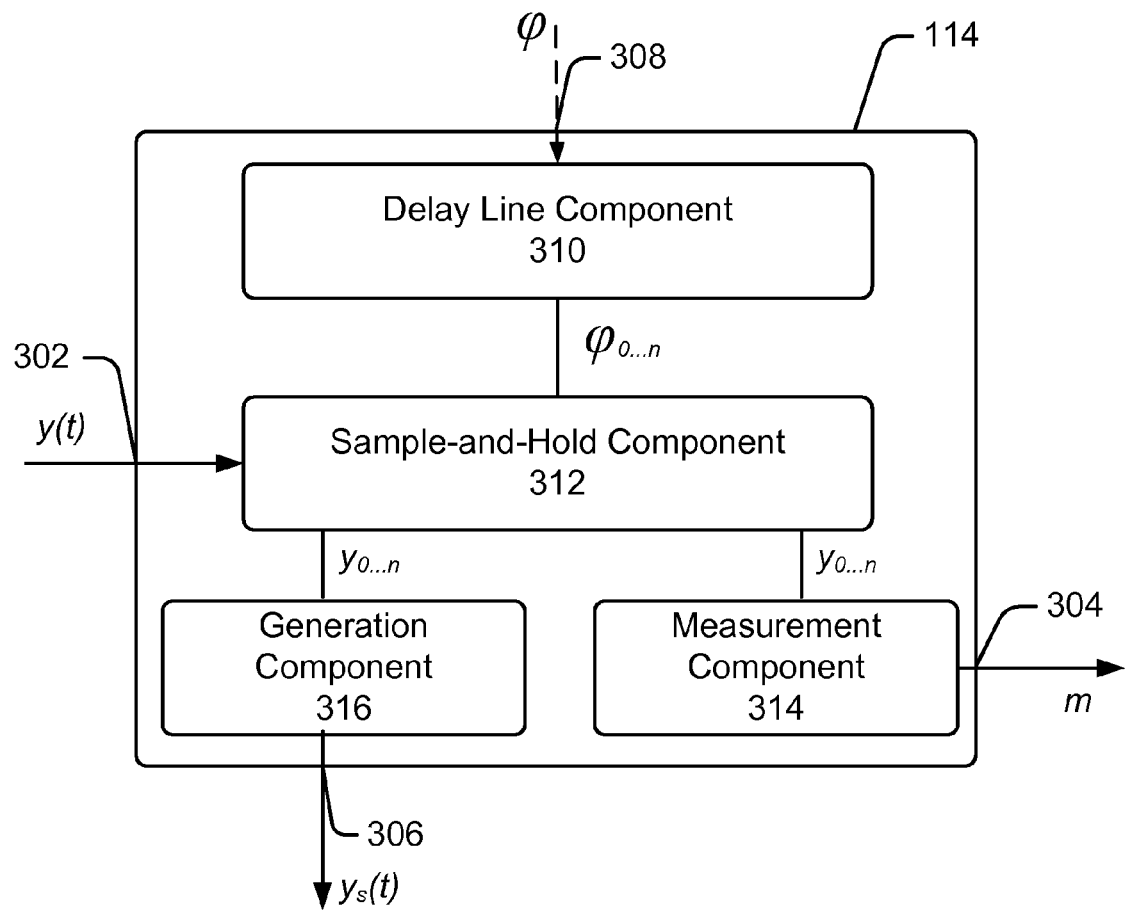
FIG. 3 is a schematic representation of one exemplary TDC.

FIG. 3 illustrates one exemplary TDC 114. The TDC 114 may include an input terminal 302 to receive a binary continuous time signal y(t); a first output terminal 304 to provide a multilevel discrete time and discrete amplitude signal m; and a second output terminal 306 to provide a binary discrete time signal $y_s(t)$. The TDC 114 may optionally have a second input terminal 308 to receive a clock signal φ, where the second terminal 308 is designated as optional with a dotted line.

The TDC 114 may include a delay line component 310 coupled to the second input terminal 308 to receive the clock signal φ. The delay line component 310 may be a multiphase component having a plurality of delay elements. The delay line component 310 generates a multiphase signal $\phi_{0-n}$, where n corresponds to the number of delay elements in the delay line.

The delay line component 310 may be configured according to well known techniques and may have a linear or ring arrangement of delay elements. Each delay element may consist of, for example, two inverters and a cross-coupled inverter-pair to keep the outputs in opposite phases. The delay elements may be tunable with voltage controlled load capacitances such that the time resolution may be varied between 60 and 150 ps.

The total delay of the delay line component 310 does not need to be locked to the period of the reference clock. However, the delay line should have a sufficient length to at least cover the entire clock period, with some extra margin to address delay variations caused by supply noise, temperature changes and process variations. This may be guaranteed by decreasing the resolution for lower operation frequencies by presetting the delay of the delay cells to a higher value.

The TDC 114 may also include a sample-and-hold component 312 coupled to the first input terminal 302 to sample the binary continuous time signal y(t). The sample-and-hold component 312 may also be coupled to the delay line 310 to receive the multiphase signal $\phi_{0-n}$. The sample-and-hold component 312 may be multiphase and may include n sample-and-hold bistable multivibrators or flip flops that sample the input y(t) at different phases of the reference clock $\phi_{0-n}$. The flip flops, which may be differential flip flops, are triggered essentially simultaneously to determine one or more edges of the pulses in the continuous time signal y(t).

The sample-and-hold component 312 provides a multiphase continuous time signal $y_{0-n}$, which may be utilized by a measurement component 314 and a generation component 316.

The measurement component 314 is coupled to the sample-and-hold component 312 to receive the multiphase continuous time signal $y_{0-n}$. The measurement component 316 provides the multilevel discrete time and discrete amplitude signal m to the first output terminal 304. The measurement component 314 may include circuitry for synchronization and edge detection. The signal m may utilized to generate the digital signal z(t).

The generation component 316 is also coupled to the sample-and-hold component 312 to receive the multiphase continuous time signal $y_{0-n}$. The generation component 316 may be a digital-to-time converter or other suitable device to provide the binary discrete time signal $y_s(t)$ as a square wave to the second output terminal 306. The binary discrete time signal $y_s(t)$ may have similar attributes to y(t), however, the binary discrete time signal $y_s(t)$ has pulse edges that have been time quantized.

The 1-bit quantized signal $y_s(t)$ of the signal y(t) is formed by taking the OR and NAND function of the y(t) sampled signal. The OR function generates a SET signal of which the location of the rising edge corresponds to the clock phase nearest to the rising edge of the input, while the NAND function generates a RESET signal of which the location of the rising edge corresponds to the clock phase nearest to the falling edge of the input. By using a Set/Reset (SR)-latch, the quantized output is eventually generated.

Exemplary Method

Figure 4:
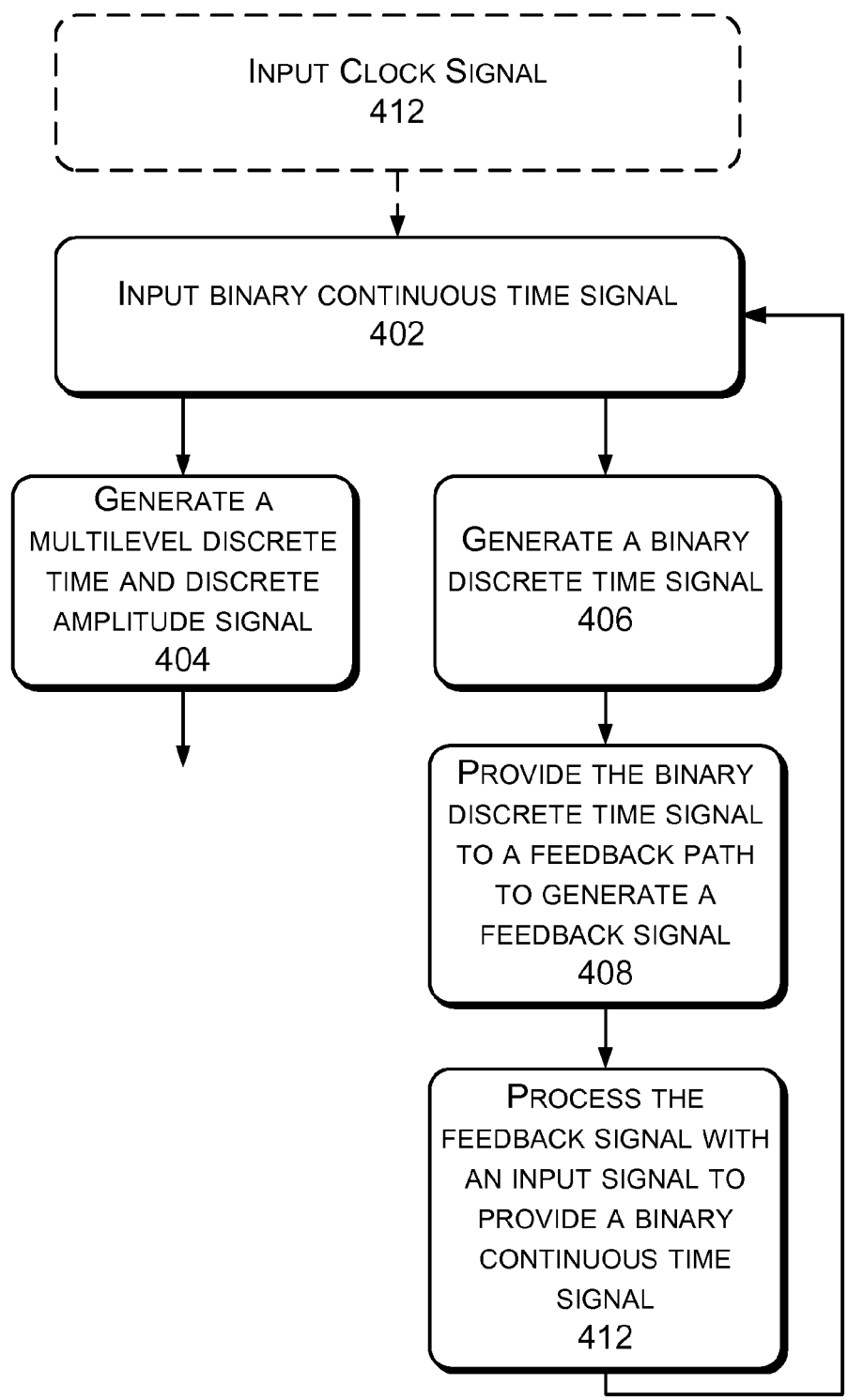
FIG. 4 is a flow chart showing an exemplary method 400 of measuring an input signal and generating multiple output signals from a TDC.

FIG. 4 is a flow chart showing an exemplary method 400 of measuring the duty cycle of a continuous time signal and generating a time quantized multilevel discrete time and discrete amplitude signal. Specifics of exemplary methods are described below. However, it should be understood that certain acts need not be performed in the order described, and may be modified, and/or may be omitted entirely, depending on the circumstances. Moreover, the acts described may be implemented by a computer, processor or other computing device based on instructions stored on one or more computer-readable media. The computer-readable media can be any available media that can be accessed by a computing device to implement the instructions stored thereon.

At 402, a binary continuous time signal is input into a TDC, such as TDC 114. The continuous time signal, e.g. y(t) in FIG. 3, may be pulse width modulated.

At 404, a multilevel discrete time and discrete amplitude signal is generated. The multilevel discrete time and discrete amplitude signal, e.g. m, may be generated by a measurement component, such as measurement component 314. The multilevel discrete time and discrete amplitude signal represents in a digital form a measurement of the width of the duty cycle of the continuous time signal.

At 406, a binary discrete time signal is generated. The binary discrete time signal, e.g. $y_s(t)$, may be generated by a generation component, such as a digital-to-time converter.

At 408, the binary discrete time signal is provided to a feedback path to generate a feedback signal. The feedback signal may be generated using a DAC to convert the binary discrete time signal to an analog form.

At 410, the feedback signal is combined with an input signal to provide the binary continuous time signal, which then may be input into the TDC as discussed above.

At 412, an optional clock signal (designated as optional using dotted lines) may be provided to the time-to-digital converter. This allows the synchronization of the multilevel discrete time and discrete amplitude signal to the clock signal.

CONCLUSION

For the purposes of this disclosure and the claims that follow, the terms "coupled" and "connected" may have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

The invention claimed is:

1. A system configured to perform analog-to-digital signal conversion, the system comprising:
   one or more electronic components configured to receive an input signal and a feedback signal and to provide as an output a binary continuous time signal; and
   a time-to-digital converter configured to receive the binary continuous time signal and to provide a multilevel discrete time and discrete amplitude signal and a binary discrete time signal, the binary discrete time signal provided in a feedback path, the feedback path including a single bit digital-to-analog converter to provide the feedback signal as an analog feedback signal.

2. A system according to claim 1, wherein the multilevel discrete time and discrete amplitude signal is synchronous.

3. A system according to claim 1, wherein the multilevel discrete time and discrete amplitude signal are asynchronous.

4. A system according to claim 1, wherein the electronic components comprise a node coupled to an integrator and a relay coupled to the integrator, wherein the node is configured to enable an input signal to be combined with the feedback signal provided through the feedback path and to provide a combined signal as an output, and wherein the relay is configured to receive the combined signal and to provide the binary continuous time signal as an output.

5. A system according to claim 1, wherein the time to digital converter is configured to receive a clock signal.

6. A system according to claim 1, wherein the feedback path is configured to utilize the binary discrete time signal to perform a noise shaping function.

7. A system according to claim 1, further comprising a demodulator configured to receive the multilevel discrete time and discrete amplitude signal and to provide a demodulated signal corresponding to the multilevel discrete time and discrete amplitude signal.

8. A wireless device comprising the analog-to-digital conversion system according to claim 1.

9. A time-to-digital converter comprising:
   an first input terminal to receive a binary continuous time signal;
   a second input terminal to receive a clock signal;
   a first output terminal to provide a multilevel discrete time and discrete amplitude signal;
   a second output terminal to provide a binary discrete time signal;
   a delay line component coupled to the second input terminal to receive the clock signal and to generate a multiphase signal;
   a sample-and-hold component coupled to the first input terminal to receive the binary continuous time signal and coupled to the delay line to receive the multiphase signal, the sample-and-hold component providing a multiphase continuous time signal;
   a measurement component coupled to the sample-and-hold component to receive the multiphase continuous time signal, the measurement component further coupled to the first output terminal to provide the multilevel discrete time and discrete amplitude signal; and
   a generation component coupled to the sample-and-hold component to receive the multiphase continuous time signal, the generation component further coupled to the second output terminal to provide the binary discrete time signal.

10. A time-to-digital converter according to claim 9, wherein the delay line component, the sample and hold component, and the measurement component are multiphase components.

11. A time-to-digital converter according to claim 9, wherein the delay line component has a linear arrangement of delay elements.

12. A time-to-digital converter according to claim 9, wherein the delay line component has a ring arrangement of delay elements.

13. A time-to-digital converter according to claim 9, wherein the generation component comprises a digital-to-time converter.

* * * * *